(12) United States Patent
Xu et al.

(10) Patent No.: US 11,152,586 B2
(45) Date of Patent: Oct. 19, 2021

(54) DISPLAY PANELS HAVING PIXEL CIRCUITS IN GROOVED SUBSTRATE

(71) Applicant: YUNGU (GU'AN) TECHNOLOGY CO., LTD., Langfang (CN)

(72) Inventors: Lin Xu, Kunshan (CN); Bo Yuan, Kunshan (CN); Rusheng Liu, Kunshan (CN); Genmao Huang, Kunshan (CN); Cuicui Sheng, Kunshan (CN)

(73) Assignee: YUNGU (GU'AN) TECHNOLOGY CO., LTD., Langfang (CN)

(*) Notice: Subject to any disclaimer, the term of this patent is extended or adjusted under 35 U.S.C. 154(b) by 9 days.

(21) Appl. No.: 16/746,978

(22) Filed: Jan. 20, 2020

(65) Prior Publication Data

US 2020/0152904 A1 May 14, 2020

Related U.S. Application Data

(63) Continuation of application No. PCT/CN2019/084268, filed on Apr. 25, 2019.

(30) Foreign Application Priority Data

Jul. 23, 2018 (CN) .......................... 201810809722.X

(51) Int. Cl.
*H01L 51/52* (2006.01)
*H01L 51/00* (2006.01)
(Continued)

(52) U.S. Cl.
CPC ........ *H01L 51/5209* (2013.01); *H01L 27/326* (2013.01); *H01L 51/0097* (2013.01);
(Continued)

(58) Field of Classification Search
CPC ............ H01L 51/5209; H01L 51/0097; H01L 51/5253; H01L 27/326; H01L 2251/5338; H01L 31/02366; G02F 1/133305
See application file for complete search history.

(56) References Cited

U.S. PATENT DOCUMENTS 6,590,346 B1 * 7/2003 Hadley ............... H01L 23/5389
257/E21.705
8,614,698 B2 * 12/2013 Desieres ............. H01L 51/5206
345/204

(Continued)

FOREIGN PATENT DOCUMENTS

CN 103545321 A 1/2014
CN 107910336 A 4/2018
(Continued)

OTHER PUBLICATIONS

CN First Office Action with search report dated Sep. 29, 2019 in the corresponding CN application (application No. 201810809722.X).
(Continued)

*Primary Examiner* — Ida M Soward
(74) *Attorney, Agent, or Firm* — Kilpatrick Townsend & Stockton

(57) ABSTRACT

The present application provides a display panel includes a substrate and a thin film transistor layer. The substrate included a surface defining a plurality of first grooves. The thin film transistor layer is disposed on the surface of the substrate defining the first grooves. The thin film transistor layer includes a plurality of pixel circuits. The pixel circuits are located in the first grooves.

20 Claims, 4 Drawing Sheets

(51) Int. Cl.
    *H01L 27/32*     (2006.01)
    *H01L 31/02*     (2006.01)
    *G02F 1/133*     (2006.01)
    *G02F 1/1333*     (2006.01)
    *H01L 31/0236*     (2006.01)

(52) U.S. Cl.
    CPC .... *H01L 51/5253* (2013.01); *G02F 1/133305* (2013.01); *H01L 31/02366* (2013.01)

(56) References Cited

U.S. PATENT DOCUMENTS

| | | | |
|---|---|---|---|
| 9,178,157 B2* | 11/2015 | Shin | H01L 27/3211 |
| 10,050,026 B2* | 8/2018 | Takeya | H01L 33/62 |
| 10,319,751 B2* | 6/2019 | Cheng | H01L 27/1248 |
| 10,651,253 B2* | 5/2020 | Ohara | H01L 27/3248 |
| 11,005,056 B2* | 5/2021 | Li | H01L 51/56 |
| 2015/0102324 A1 | 4/2015 | Lee | |
| 2017/0301661 A1* | 10/2017 | Makimura | H01L 31/035272 |
| 2018/0374904 A1* | 12/2018 | Xu | H01L 27/3213 |
| 2019/0013336 A1* | 1/2019 | Zhang | H01L 27/1225 |
| 2019/0312231 A1* | 10/2019 | Huang | H01L 51/56 |
| 2019/0333940 A1 | 10/2019 | Zeng et al. | |
| 2019/0341406 A1* | 11/2019 | Liu | H01L 27/1244 |

FOREIGN PATENT DOCUMENTS

| | | |
|---|---|---|
| CN | 107968152 A | 4/2018 |
| CN | 207517287 U | 6/2018 |
| CN | 109037278 A | 12/2018 |

OTHER PUBLICATIONS

Office Action of Chinese Patent Application No. 201810809722.X.
International Search Report of International Patent Application No. PCT/CN2019/084268.

* cited by examiner

DISPLAY PANELS HAVING PIXEL CIRCUITS IN GROOVED SUBSTRATE

CROSS-REFERENCES TO RELATED APPLICATIONS

This application is a continuation application of international application PCT/CN2019/084268, filed on Apr. 25, 2019, which claims the priority benefit of Chinese patent application No. 201810809722. X, entitled "DISPLAY PANEL AND DISPLAY DEVICE", and filed on Jul. 23, 2018. The entireties of these applications are incorporated by reference herein for all purposes.

FIELD

The present application relates to the display technology.

BACKGROUND

With the development of information technology, display devices such as mobile phones have become indispensable in people's lives.

Generally, the display device includes a display panel. The display panel includes a substrate and a thin film transistor (TFT) layer disposed on the substrate. The TFT layer includes a plurality of pixel circuits.

SUMMARY

The present application provides a display panel.

The display panel includes a substrate and a TFT layer. The substrate includes a surface defining a plurality of first grooves. The TFT layer is disposed on a side of the substrate, and the side has the first grooves defined thereon. The TFT layer includes a plurality of pixel circuits. The pixel circuits are located in the first grooves.

In an embodiment, the substrate is a flexible substrate.

In an embodiment, a region of the surface, outside the first grooves, of the substrate is non-flat. In an embodiment, the region of the surface, outside the first grooves, of the substrate defines a plurality of second grooves.

In an embodiment, the second grooves have a depth that is smaller than a depth of the first grooves. In an embodiment, a side edge of a cross section of the first grooves in a direction perpendicular to the surface of the substrate is non-straight.

In an embodiment, the side edge of the cross section of the first grooves in the direction perpendicular to the surface of the substrate has a wave-shape or a tooth-shape.

In an embodiment, the substrate includes a polyimide (PI) layer. The first grooves are defined by the PI layer.

In an embodiment, the substrate includes a plurality of PI layers. The first grooves are defined by at least one PI layer adjacent to the TFT layer.

In an embodiment, the first grooves are defined by successive PI layers adjacent to the TFT layer.

In an embodiment, the substrate includes a barrier layer disposed between adjacent two PI layers.

In an embodiment, the second groove is filled with a buffer material. The buffer material has a flexibility greater than a flexibility of the substrate.

In an embodiment, the region of the surface, outside the first grooves, of the substrate includes a plurality of support portions independent from each other.

In an embodiment, each of the pixel circuits is located in one of the first grooves.

In an embodiment, another barrier layer is located between the substrate and the TFT layer.

In an embodiment, the display panel further includes a planarization layer located on a side of the TFT layer away from the substrate.

In an embodiment, the display panel further includes an OLED member layer disposed on a side of the TFT layer away from the substrate. The OLED member layer includes a plurality of light emitting members. The light emitting members are located in the first grooves.

The present application further provides a display device. The display device includes the display panel.

DETAILED DESCRIPTION OF THE INVENTION

In the recent years, flexible displays are gaining popularity. When the display panel is a flexible panel, the display panel needs to be capable of being repeatedly bent for many times.

The present application will now be described in detail with reference to the accompanying drawings and embodiments in order to make the objects, technical solutions, and advantages of the present application more clear. The embodiments described herein are for the purpose of explaining the application and are not intended to limit the application.

A display panel in use is likely to have a stress concentration phenomenon at a local area upon an external impact. A serious stress concentration may cause the local area of the display panel unable to normally display. Especially if the display panel is a flexible panel and has been repeatedly bent for many times, due to the uneven force applied in the display panel, stress tends to be concentrated at some area rather than dissipated, thereby causing damages to internal components, and limiting the application field and the bending manner of the flexible display panel.

The external force acted on the display panel is passed to the pixel circuit, causing the stress concentration phenomenon in the pixel circuit. The serious stress concentration may damage the pixel circuit, and may even cause a break or a loose connection of the pixel circuit, such that the local area of the display panel cannot normally display.

The present application provides a display panel configured for reducing the stress acting on the pixel circuit, thereby protecting sub-pixels and preventing the local area of the display panel from being unable to normally display.

Figure 1:
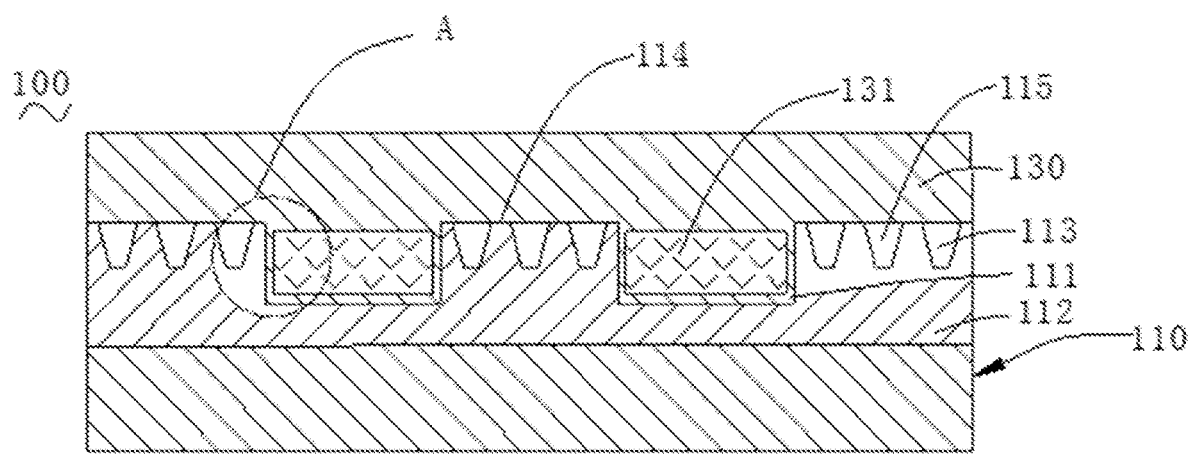
FIG. 1 is a schematic cross-sectional view of an embodiment of a display panel of the present application.

Referring to FIG. 1, an embodiment of the present application provides a display panel 100 including a substrate 110 and a TFT layer 130 disposed on the substrate 110.

A surface of the substrate 110 defines a plurality of first grooves 111. The TFT layer 130 is disposed on one side of the substrate 110 defining the first grooves 111. The TFT layer 130 includes a plurality of pixel circuits 131. The pixel circuits 131 are located in the first grooves 111.

When the display panel 100 is impacted by an external force, the regions of the substrate 110 that do not have the first groove 111 defined therein firstly withstand and dissipate the stress, thereby reducing the stress acting on the pixel circuits 131, effectively preventing the pixel circuits 131 from being damaged due to overlarge stress, and preventing the local area of the display panel 100 from being unable to normally display.

In an embodiment, the pixel circuit 131 is completely located in the first groove 111. One side of the pixel circuit 131 away from the substrate 110 is located in the first groove 111. The pixel circuit 131 has a thickness smaller than a depth of the first groove 111.

The depth of the first groove 111 can depend on the thickness of the pixel circuit 131.

The first groove 111 has a width that is capable of having the pixel circuit 131 placed in the first groove 111. The width of the first groove 111 needs to be properly set in order to avoid the regions of the substrate 110 that do not have the first grooves 111 defined therein being too small to have a supporting ability.

In an embodiment, the substrate 110 is a flexible substrate. The substrate 110 has a flexibility to relieve the stress, thereby further reducing the stress acting on the pixel circuits 131.

In addition, with the development of information technology, the size of the display devices such as mobile phones is getting larger and larger in order to have better visual effects. However, the display devices having the larger size are not easy to carry. Flexible display panels are increasingly applied in the display devices due to their bendable nature.

The inventors have found in the research that, when the flexible display panel is bent, bending stress will be generated in the bending region of the flexible display panel. The bending stress acting on the pixel circuits of the bending region induces the stress concentration phenomenon on the pixel circuits. When the stress concentration is serious, the pixel circuits of the bending region may be damaged due to the overlarge bending stress acting on the pixel circuits, and the bending region may be unable to normally display.

In the present embodiment, when the display panel 100 is bent, the first grooves 111 can alleviate the stress acting on the pixel circuits 131, reduce the bending stress acting on the pixel circuits 131, and prevent the pixel circuits 131 from being damaged due to the overlarge stress acting on the pixel circuits 131, thereby effectively preventing the local area of the display panel 100 from being unable to normally display.

Furthermore, the first grooves 111 increase the bending resistance of the substrate 110. When the display panel 100 is bent and deformed under the action of the external force, the regions that do not have the first grooves 111 defined therein undergo a relatively small deformation, reducing the bending stress acting on the substrate 110, thereby reducing the stress acting on the pixel circuits 131, preventing the pixel circuits 131 from being damaged due to overlarge bending stress, and preventing the display panel 100 from being unable to normally display due to the deformation of bending.

The substrate 110 can also be a non-flexible substrate. The display panel 100 can also be a non-flexible display panel. In other words, the grooves 111 defined by the flexible substrate 110 and the pixel circuits 131 of the TFT layer 130 disposed in the grooves 111 can also be applied to the non-flexible display panel.

Since a plurality of first grooves 111 are defined by the surface of the substrate 110, the surface of the substrate 110 has a concave-convex structure. The first grooves 111 are concave regions of the concave-convex structure, and the remaining regions are convex regions of the concave-convex structure.

In an embodiment, regions of the surface, outside the first grooves 111, of the substrate 110 have a non-flat shape. In other words, the surface of the convex region of the concave-convex structure adjacent to the TFT layer 130 is not flat.

The non-flat regions of the surface outside the first grooves 111 can increase the flexibility of the convex regions, thereby better buffering the stress acting on the convex regions, further reducing the stress acting on the pixel circuits 131, preventing the pixel circuits 131 from being damaged due to overlarge stress acting on the pixel circuits 131, and more effectively preventing the local area of the display panel 100 from being unable to normally display.

In an embodiment, the regions of the surface, outside the first grooves 111, of the substrate 110 define a plurality of second grooves 113. The non-flatness is achieved by defining the grooves in the convex regions of the surface of the substrate 110.

Since the first grooves 111 and the second grooves 113 are all defined by one same surface of the substrate 110, the surface of the substrate 110 can be patterned by using a mask to groove the surface of the substrate 110.

In order to prevent the convex regions from skewing to lose the supporting effect of the substrate 110 after the convex region is grooved, the depth of the second groove 113 is smaller than the depth of the first groove 111. Masks can be used for two times to respectively form the first grooves 111 and the second grooves 113. A halftone mask can also be employed to simultaneously form the first grooves 111 and the second grooves 113.

In other embodiments, the first grooves 111 and the second grooves 113 are not limited to be formed by using the mask. For example, a patterned flexible substrate can be directly formed, or the first grooves 111 and the second grooves 113 can be formed by laser grooving or the like.

In other embodiments, the non-flatness of the convex regions is not limited to be formed by grooving. For example, a plurality of independent support portions 114 can be disposed in the convex region to achieve the non-flatness of the convex regions.

In other embodiments, the second groove 113 can be filled with a flexible material 115. The flexibility of the flexible material 115 is greater than the flexibility of the substrate 110 in order to better buffer the stress through a deformation of the flexible material 115 filled in the second groove 113.

In an embodiment, a side edge of a cross section of the first groove 111 in a direction perpendicular to the surface of the substrate 110 is non-straight. That is, in the direction perpendicular to the surface of the substrate 110, the side edge of the cross section of the convex region of the concave-convex structure is non-straight, thereby increasing the flexibility of the convex regions of the concave-convex structure in this direction, and better alleviating the stress acting on the convex regions.

Figure 2:
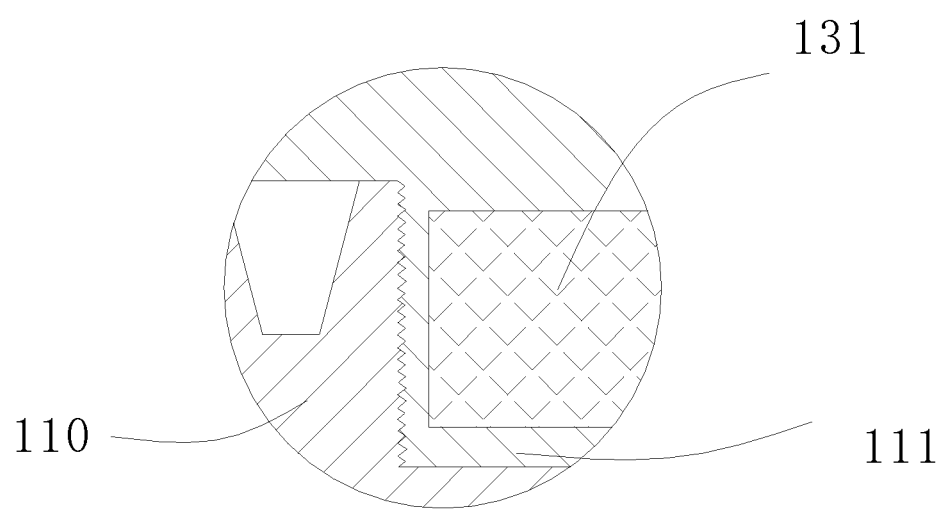
FIG. 2 is an enlarged view of an embodiment of an area A of FIG. 1.

Referring to FIG. 2, in an embodiment, the side edge of the cross section of the first groove 111 in the direction perpendicular to the surface of the substrate 110 is toothshaped.

Figure 3:
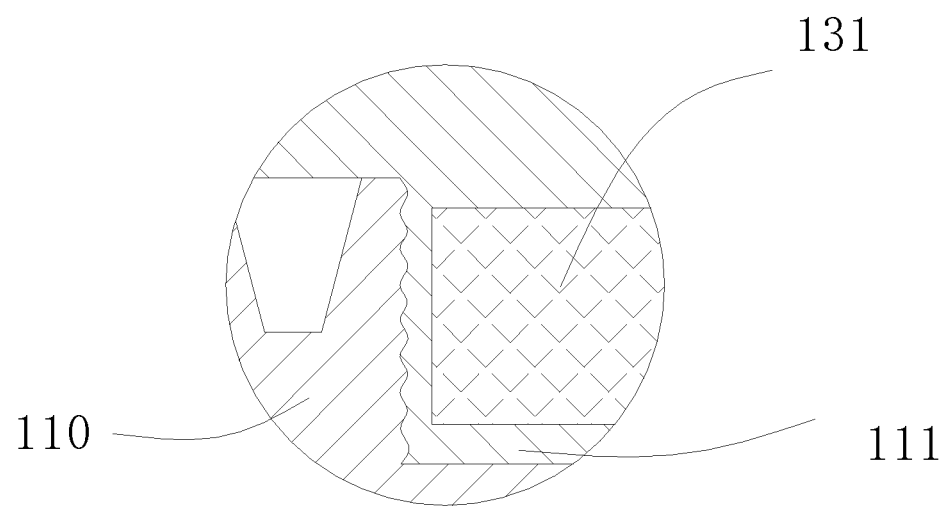
FIG. 3 is an enlarged view of another embodiment of an area A of FIG. 1.

Referring to FIG. 3, in another embodiment, the side edge of the cross section of the first groove 111 in the direction perpendicular to the surface of the substrate 110 is waveshaped.

In still another embodiment, each of the first grooves 111 has one pixel circuit 131 located therein, so that the convex regions of the concave-convex structure are distributed adjacent to every pixel circuit 131, thereby the stress around the pixel circuits 131 can be better alleviated, and further alleviating the stress acting on the pixel circuits 131.

In an embodiment, the substrate 110 includes a polyimide (PI) layer 112, that is, a layer made of polyimide. The plurality of first grooves 111 are defined by the PI layer 112. In another embodiment, the substrate 110 includes a plurality of PI layers 112. The first grooves 111 are defined by the PI layer 112 of the side of the substrate 110 adjacent to the TFT layer 130, or defined by successive two or more PI layers of the substrate 110 adjacent to the TFT layer 130.

In an embodiment, a barrier layer is disposed between the substrate 110 and the TFT layer 130 for blocking water and oxygen to prevent external water and oxygen from infiltrating the pixel circuits 131. In an embodiment, the substrate 110 includes at least two PI layers 112, a barrier layer is disposed between adjacent two PI layers 112. In an embodiment, at least one barrier layer is disposed in the first groove 111.

In an embodiment, a planarization layer is further disposed on one side of the TFT layer 130 away from the substrate 110 such that a surface of the TFT layer 130 away from the substrate 110 is flat to facilitate formation of the OLED member layer.

Figure 4:
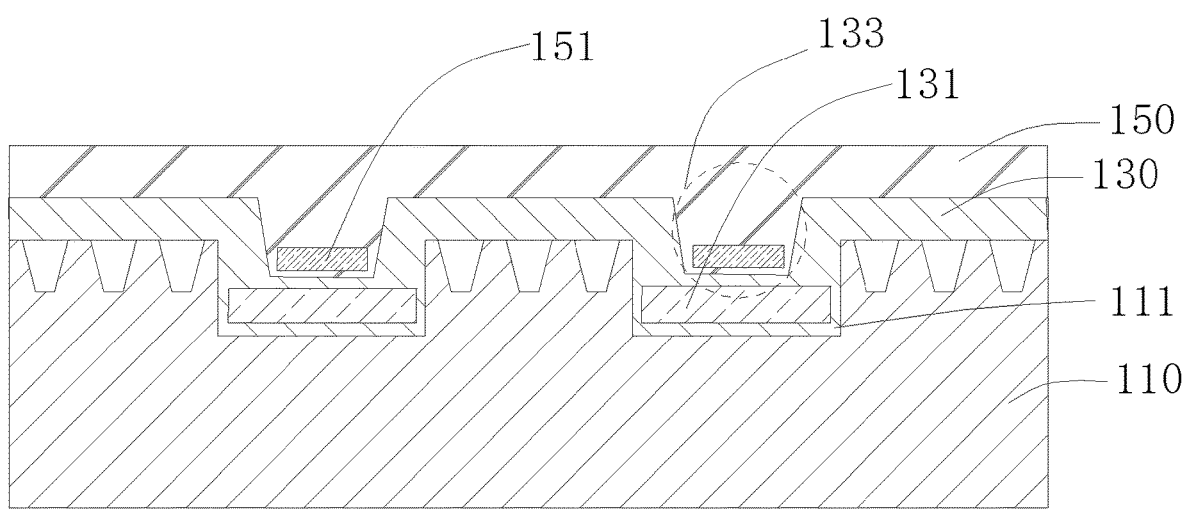
FIG. 4 is a schematic cross-sectional view of an embodiment of a display panel of the present application.

In an embodiment of, referring to FIG. 4, the TFT layer 130 defines concave regions 133 corresponding to the first grooves 111 at the side of the TFT layer 130 away from the substrate 110. The display panel 100 further includes an OLED member layer 150 disposed on one side of the TFT layer 130 away from the substrate 110. The OLED member layer 150 includes a plurality of light emitting members 151. The light emitting members 151 are disposed in the concave regions 133. In an embodiment, the light emitting member 151 is also located in the first groove 111. When the display panel 100 is impacted by an external force, the convex region of the concave-convex structure of the substrate 110 firstly withstands and disperses the stress instead for the light emitting members 151, thereby alleviating the stress acting on the light emitting members 151, and further preventing the light emitting members 151 from being damaged due to stress concentration. The surface of the TFT layer 130 away from the substrate 110 in this embodiment is not flat.

In some embodiments, the display panel 100 further includes an encapsulation layer and the like located on the TFT layer 130. The structure of the OLED member layer 150, the encapsulation layer, and the like can be formed by techniques in the art.

The TFT layer 130 in some embodiments further includes a gate insulating layer, a dielectric layer, an interlayered insulating layer, and the like. The structure, such as the thickness and whether or not to have grooves, of the gate insulating layer, the dielectric layer, the interlayered insulating layer, and the like can be decided according to techniques in the art.

An embodiment of the present application further provides a display device including the above-described display panel 100.

The technical features of the above-described embodiments can be arbitrarily combined. For the sake of brevity of description, not all possible combinations of the technical features in the embodiments are described. However, as long as there is no contradiction in the combinations of these technical features, the combinations should be considered as in the scope of this specification.

The above embodiments merely illustrate several implementations of this application, and the description thereof is specific and detailed, but shall not be constructed as limiting the protection scope of the application. For a person of ordinary skill in the art, variations and improvements can be made without departing from the concept of this disclosure, and these are all within the protection scope of this disclosure. The protection scope of this application shall be decided by the appended claims.

The invention claimed is:

1. A display panel, comprising:
   a substrate comprising a surface defining a plurality of first grooves; and
   a thin film transistor layer disposed on the surface of the substrate, the thin film transistor layer comprising a plurality of pixel circuits, the pixel circuits being located in the first grooves.

2. The display panel of claim 1, wherein the pixel circuit has a thickness less than a depth of one of the first grooves.

3. The display panel of claim 1, wherein the substrate comprises a flexible substrate.

4. The display panel of claim 1, wherein a region of the surface positioned outside the first grooves of the substrate is non-flat.

5. The display panel of claim 4, wherein the region of the surface further comprises a plurality of support portions independent from each other.

6. The display panel of claim 4, wherein the region of the surface defines a plurality of second grooves.

7. The display panel of claim 6, wherein the first grooves are deeper than the second grooves.

8. The display panel of claim 6, further comprising a buffer material filled in the second grooves, and the buffer material is more flexible than the substrate.

9. The display panel of claim 1, wherein a side edge of a cross section of the first grooves in a direction perpendicular to the surface of the substrate is non-straight.

10. The display panel of claim 9, wherein the side edge of the cross section of the first grooves in the direction perpendicular to the surface of the substrate has a wave-shape or a tooth-shape.

11. The display panel of claim 1, wherein the substrate comprises a polyimide layer, and the first grooves are defined by the polyimide layer.

12. The display panel of claim 1, wherein the substrate comprises a plurality of polyimide layers, and the first grooves are defined by at least one of the PI layers adjacent to the thin film transistor layer.

13. The display panel of claim 1, wherein the substrate comprises a plurality of polyimide layers, and the first grooves are defined by successive layers of the polyimide layers adjacent to the thin film transistor layer.

14. The display panel of claim 1, wherein the substrate comprises at least two polyimide layers and a first barrier layer disposed between the two polyimide layers adjacent to the thin film transistor layer.

15. The display panel of claim 1, wherein each of the pixel circuits is located in one of the first grooves.

16. The display panel of claim 1 further comprising a second barrier layer located between the substrate and the thin film transistor layer.

17. The display panel of claim 1 further comprising a planarization layer located on a side of the thin film transistor layer away from the substrate.

18. The display panel of claim 1 further comprising an OLED member layer disposed on a side of the thin film transistor layer away from the substrate, wherein the OLED member layer comprises a plurality of light emitting members, and the light emitting members are located in the first grooves.

19. A display device comprising the display panel of claim 1.

20. A display panel, comprising:
- a substrate comprising a surface defining a plurality of first grooves; and
- a thin film transistor layer disposed on the surface of the substrate, the thin film transistor layer comprising a plurality of pixel circuits, the pixel circuits being located in the first grooves;
- wherein a region of the surface positioned outside the first grooves of the substrate is non-flat.

* * * * *